(12) United States Patent
Beitelmal et al.

(10) Patent No.: US 6,662,865 B2
(45) Date of Patent: *Dec. 16, 2003

(54) MULTI-LOAD THERMAL REGULATING SYSTEM HAVING ELECTRONIC VALVE CONTROL

(75) Inventors: Abdlmonem H. Beitelmal, Palo Alto, CA (US); Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 145 days.

This patent is subject to a terminal disclaimer.

(21) Appl. No.: 09/843,761

(22) Filed: Apr. 30, 2001

(65) Prior Publication Data

US 2002/0157820 A1 Oct. 31, 2002

(51) Int. Cl.$^7$ .................................................. F24F 3/00
(52) U.S. Cl. ...................... 165/206; 165/263; 62/259.2
(58) Field of Search ............................... 165/206, 263, 165/264, 80.4, 80.5; 62/259.2

(56) References Cited

U.S. PATENT DOCUMENTS

| | | | | |
|---|---|---|---|---|
| 2,606,747 A | * | 8/1952 | Williams | 165/206 |
| 4,084,388 A | * | 4/1978 | Nelson | 165/206 X |
| 4,729,424 A | * | 3/1988 | Mizuno et al. | 165/263 X |
| 5,198,752 A | * | 3/1993 | Miyata et al. | 165/80.4 X |
| 5,413,164 A | * | 5/1995 | Teshima et al. | 165/206 X |
| 6,000,458 A | * | 12/1999 | Watanabe | 165/263 X |
| 6,026,896 A | * | 2/2000 | Hunter | 165/206 |
| 6,089,797 A | * | 7/2000 | Chen et al. | 165/206 X |
| 6,102,113 A | * | 8/2000 | Cowans | 165/264 X |
| 6,138,469 A | * | 10/2000 | Davidson et al. | 62/259.2 |
| 6,182,742 B1 | * | 2/2001 | Takahashi et al. | 62/259.2 X |
| 6,415,619 B1 | * | 7/2002 | Bash et al. | 62/228.4 |
| 2002/0104646 A1 | * | 8/2002 | Jeong | 165/206 |
| 2002/0124585 A1 | * | 9/2002 | Bash et al. | 62/228.4 |
| 2002/0157821 A1 | * | 10/2002 | Beitelmal et al. | 165/206 |

OTHER PUBLICATIONS

US 5,706,890, 1/1998, Sloan et al. (withdrawn)*

* cited by examiner

Primary Examiner—Ljiljana Ciric

(57) ABSTRACT

In a thermal regulating system, individual temperatures of a plurality of components are maintained within a predetermined temperature range. This thermal regulating system includes a refrigeration system having a refrigerant contained in a refrigerant line, a valve capable of being electronically controlled, a plurality of evaporators configured for thermal attachment to the components, and a supplemental heating system. The valve is configured to control superheat formation in the refrigeration system. Furthermore, the refrigeration system and the supplemental heating system are operable to maintain each of the plurality of components within the predetermined temperature range.

15 Claims, 2 Drawing Sheets

MULTI-LOAD THERMAL REGULATING SYSTEM HAVING ELECTRONIC VALVE CONTROL

FIELD OF THE INVENTION

This invention relates generally to a system for maintaining the temperature of components in an electronic system within a predetermined range. More particularly, the invention pertains to a refrigeration system having multiple evaporators connected in series to cool multiple heat generating components in an electronic system and a supplemental heating system having multiple individual heaters to reduce temperature variation among the components in a multi-component system.

BACKGROUND OF THE INVENTION

The components (e.g., processors, micro-controllers, high speed video cards, disk drives, semi-conductor devices, etc.) of an electronic system are generally known to generate rather significant amounts of heat. It has been found that the performance and reliability of the heat generating components typically deteriorate as the components become increasingly heated and may cause component failure. Electronic systems are thus generally equipped with a mechanism (e.g., a fan) attached to the housing of the electronic system to cool the components as well as the interior of the electronic system. Although these types of mechanisms have been relatively effective in cooling the components of certain types of electronic systems, they have been found to be relatively insufficient to cool the faster and more powerful components of today's electronics.

With the advent of more powerful components which generate greater amounts of heat, the possibility that the components will overheat has drastically increased. One solution to the overheating problem has been to directly cool the components themselves. In this regard, refrigeration systems have been implemented to directly cool the components. In these types of systems, an evaporator is positioned in thermal contact with a surface of the component to be cooled. These types of systems have been relatively effective in maintaining the temperatures of individual computer components within acceptable ranges. However, when an electronic system possesses a number of components ("multi-component system"), known refrigeration systems suffer from a variety of drawbacks and disadvantages.

For instance, one known technique of reducing the temperature of components in a multi-component system is to rely upon a single refrigeration system possessing a plurality of evaporators aligned in series along each of the components. One disadvantage associated with known serially positioned evaporators is that they generally do not compensate for varying heat loads in the components to substantially reduce the temperature variation among the components. That is, these types of systems do not compensate for the possibility that evaporators positioned downstream from other evaporators may be adversely affected (e.g., downstream evaporators may receive superheated fluid which may actually cause a rise in their temperature). In addition, they do not compensate for the possibility of evaporators positioned relatively upstream and producing a relatively low heat load, may actually be cooled below recommended operating temperatures.

SUMMARY OF THE INVENTION

According to one aspect, the present invention provides for the independent control of individual component temperatures by utilizing supplemental heaters in conjunction with metering the mass flow rate of refrigerant to a series of evaporators in a multi-load refrigeration system based on the heat load of the system without suffering from the drawbacks and disadvantages associated with known refrigeration systems.

According to a preferred embodiment, the present invention relates to a thermal regulating system for maintaining individual temperatures of a plurality of components within a predetermined temperature range. The thermal regulating system includes a refrigeration system having a refrigerant contained in a refrigerant line and a valve capable of being electronically controlled. The valve is configured to control superheat formation in the refrigeration system. The thermal regulating system further includes a plurality of evaporators configured for thermal attachment to the components and a supplemental heating system. In this regard, the refrigeration system and the supplemental heating system are operable to maintain each of the plurality of components within the predetermined temperature range.

Additionally, the present invention pertains to a method for thermally regulating multiple components of a computer system having multiple fluctuating heat loads. In the method, a flow of a refrigerant is controlled through a refrigerant line in a refrigeration system having a variable capacity compressor and a plurality of evaporators and a valve. The valve is configured to meter the flow of the refrigerant through the plurality of evaporators which are configured for thermal attachment to the multiple components. A temperature of the refrigerant is sensed in a position generally downstream of the plurality of evaporators, the sensed temperature is relayed to a controller, and a signal from the controller is sent to the valve to modify the flow of the refrigerant through the plurality of evaporators in response to the temperature being outside a predetermined superheat temperature range.

In accordance with another aspect, the present invention relates to a multi-load thermal regulating system for maintaining individual temperatures of a plurality of heat generating components within a predetermined temperature range. The thermal regulating system includes a plurality of evaporators thermally attachable to a respective heat generating component. The plurality of evaporators are connected in a serial arrangement. The thermal regulating system further includes a plurality of supplemental heaters. Each of the supplemental heaters are operable to supply supplemental heat to a respective component of the heat generating components.

The thermal regulating system further includes a refrigerant line for conducting refrigerant through the plurality of evaporators and a variable speed compressor connected to the refrigerant line. The variable speed compressor is operable to control the mass flow rate of the refrigerant through the refrigerant line. The thermal regulating system further includes a valve connected to the refrigerant line and configured to be manipulated by a controller in response to the sensed superheat of the refrigerant. Thus, the valve is operable to control the superheat of the refrigerant between the valve and the superheat sensor. Additionally, the controller is configured to transmit signals to the variable speed compressor to vary the mass flow rate of the refrigerant in response to a plurality of sensed temperature measurements measured by a plurality of component temperature sensors.

BRIEF DESCRIPTION OF THE DRAWINGS

Features and advantages of the present invention will become apparent to those skilled in the art from the following description with reference to the drawings, in which.

DETAILED DESCRIPTION OF THE INVENTION

For simplicity and illustrative purposes, the principles of the present invention are described by referring mainly to an exemplary embodiment thereof, particularly with references to an electronic system possessing multiple heat producing components. However, one of ordinary skill in the art would readily recognize that the same principles are equally applicable to, and can be implemented in, any device that may benefit from multiple evaporators arranged in series, and that any such variation would be within such modifications that do not depart from the true spirit and scope of the present invention.

In accordance with the principles of the present invention, the temperature of a plurality of components in a multi-component system may be maintained within a specified temperature range while temperature variation among the components may be reduced. In this respect, the temperature of each component is maintained relatively constant (approximately within 5° C.) with respect to other components, while allowing for multiple fluctuating heat loads between the components. The present invention is configured to control the temperature of each component by utilizing a combination of a refrigeration system (e.g., a vapor compression refrigeration system) and a supplemental heater. Excess heat is removed from each component by a respective evaporator. In the event that a component is relatively inactive and therefore producing relatively less heat with respect to other components, the component temperature may fall below a predetermined temperature and the supplemental heater may ultimately add heat to the component, such that the temperature of the component may be raised to be within the specified temperature range. That is, the present invention is configured to independently maintain the temperature of each component by controlling the mass flow rate of refrigerant flowing through a series of evaporators, each evaporator being attached to a respective component, in conjunction with a supplemental heating system providing a means to compensate for fluctuations in temperature of individual components.

Figure 1:
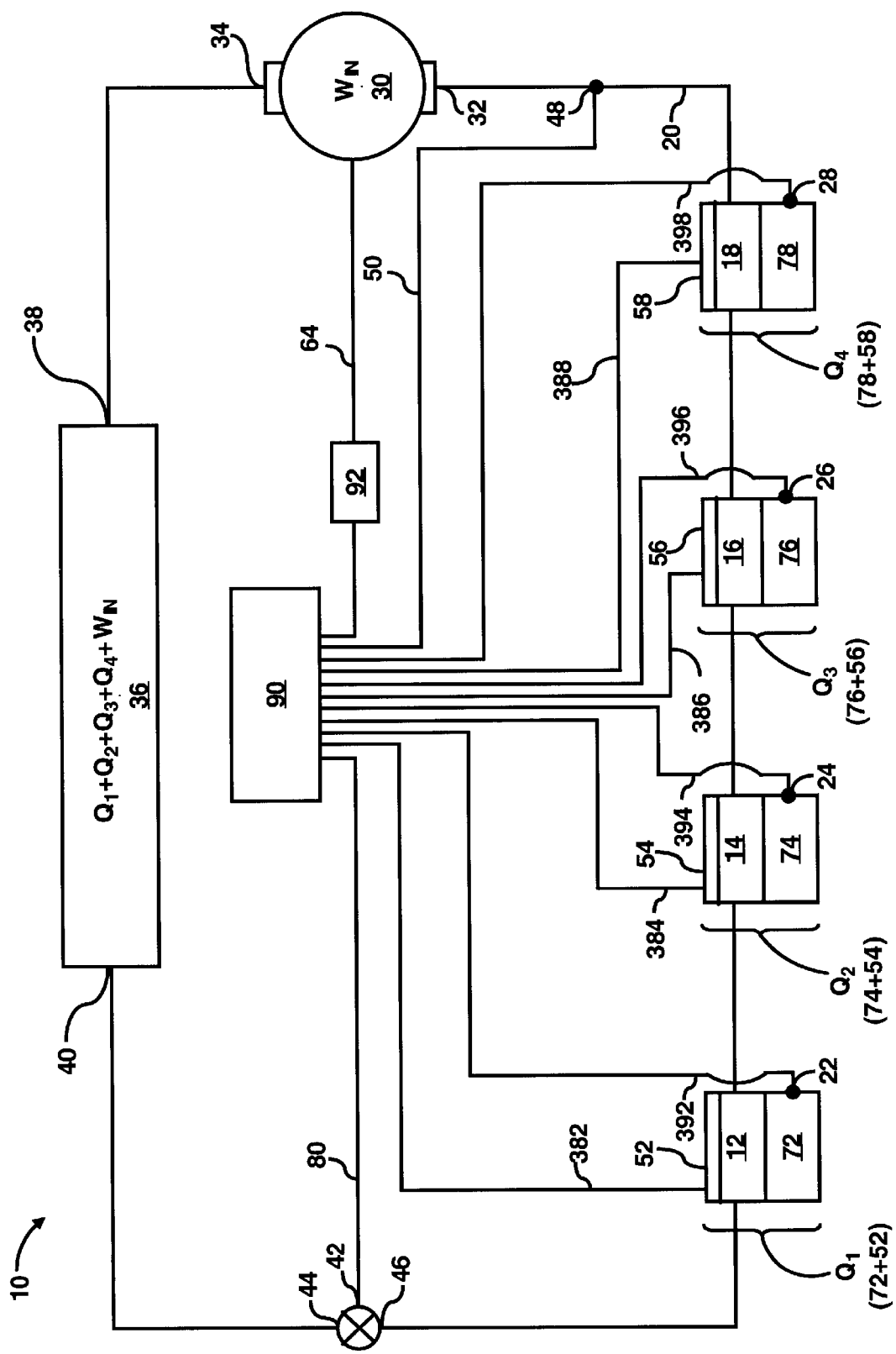
FIG. 1 illustrates a refrigeration system and a supplemental heating system for maintaining the temperature of a plurality of components in an electronic system in which a plurality of evaporators and supplemental heaters have been positioned in a serial configuration in accordance with the present invention.

In this respect, according to the principles of the present invention and as illustrated in FIG. 1, in a multi-load thermal regulating system 10, multiple evaporators 12, 14, 16, 18 (e.g., cold plates) are connected serially to one another to cool multiple components in an electronic system. A multi-load thermal regulating system 10, as referenced throughout the present disclosure, generally refers to a refrigeration system for cooling multiple heat loads (e.g., components) in conjunction with a supplemental heating system for maintaining the temperature of each heat load, of the forementioned multiple heat loads, within a predetermined range. Because the specific type of evaporator to be used in the present invention will vary according to individual needs, the present invention is not limited to any specific type of evaporator and may thus utilize any type of evaporator which may reasonably accomplish the goals of the present invention. Examples of suitable evaporators employable in the present invention are available from LYTRON, Inc. of Woburn, Mass. and THERMOTEK Co., LTD. of Texas and South Korea. However, as is readily apparent to those of ordinary skill in the art, other suitable evaporators may be used in the present invention without departing from the scope and spirit of the present invention.

Although FIG. 1 depicts four evaporators, it is to be understood that the present invention is not limited to four evaporators. Rather, the present invention may include any reasonable number of evaporators. In one respect, the number of evaporators may correspond to the number of heat generating components. Accordingly, the four evaporators depicted in FIG. 1 are for illustrative purposes only and thus is not meant to limit the present invention in any respect. Additionally, as is well known to those having ordinary skill in the art, the term "serial" is not intended to be a limitation, but rather, with respect to the present disclosure, describes the manner in which a single conduit may be controlled as a single unit.

Additionally, any suitable type of refrigerant may be utilized in the present invention. In fact, the choice of refrigerant will depend upon a plurality of factors, e.g., cooling requirements, environmental impact, cost, etc. Generally speaking, suitable refrigerants include the suite of vapor compression hydrocarbon refrigerants (CFCs, HCFSs, HFCs or any blend of pure refrigerants). Specific examples of suitable refrigerants include R134a, R290, R600, etc. Moreover, suitable refrigerants may be obtained from TONG TAI INTERNATIONAL located in Taiwan, R.O.C.

Referring again to FIG. 1, the multi-load thermal regulating system 10 possesses a closed loop for refrigerant to flow to and from the components of the multi-load thermal regulating system 10 (e.g., evaporator 12, evaporator 14, evaporator 16, evaporator 18, superheat sensor 48, compressor 30, condenser 36, and electronic expansion valve 42). Specific examples of suitable electronic expansion valves employable in the present invention are available from ALCO of St. Louis, Mo.

According to the preferred embodiment illustrated in FIG. 1, the compressor 30 is a variable capacity (speed) compressor. In other words, the compressor 30 may be controlled to either increase or decrease the mass flow rate of the refrigerant within the multi-load thermal regulating system 10. According to the principles of the present invention, a number of different types of variable capacity (speed) compressors may be utilized for proper operation of the present invention. Thus, in similar fashion to other types of refrigeration systems, the refrigerant flowing through the refrigerant line 20 changes between a gas and a liquid at various positions as the refrigerant circuits the closed loop of the multi-load thermal regulating system 10. Additionally, as is well known to those having ordinary skill in the art, the term "variable capacity compressor" is not intended to be a limitation, but rather, with respect to the present disclosure, describes a compressor in which the capacity may be controlled by manipulating the manner in which the compressor operates. Thus, when the operation of the variable capacity (speed) compressor is modified, the refrigerant mass flow rate may be altered in a like manner, e.g., as compressor speed is increased, mass flow rate is increased and thus increase the capacity of the refrigerant to cool a component attached to the refrigeration system. Moreover, the capacity of the compressor 30 may be varied from about 0 to about 100% capacity of the compressor and substantially any capacity therebetween. However, it is within the purview of this invention that any known compressor capable of suitably varying refrigerant capacity in a controlled manner may be substituted for the variable capacity (speed) compressor without departing from the scope and spirit of the invention.

Although not specifically shown in FIG. 1, the evaporators 12–18 are configured for attachment to respective heat generating components by any known means which allows for adequate thermal transfer from the components to the evaporators. Thus, each evaporator 12–18 may absorb the heat load from a respective Q1–Q4. Each Q1–Q4 illustrated in FIG. 1 represents the combined heat load of a respective component 72–78 and a corresponding supplemental heater 52–58. For example, evaporator 12 may be thermally attached to a component 72 and a supplemental heater 52. Thus, Q1 is substantially equal to the heat load of component 72 plus the heat load of the supplemental heater 52.

Although not specifically shown in FIG. 1, any suitable configuration of component, evaporator, and supplemental heater may be utilized in the present invention. In fact, the choice of configuration will depend upon a plurality of factors, e.g., cooling requirements, design constraints, condensation control, space requirements, system optimization, cost, etc. Generally speaking, suitable configurations include those that allow heat to substantially freely move from a component to a respective evaporator and moreover, from a supplemental heater to a respective component. Specific examples of suitable configurations may include: each evaporator 12–18 being located between a respective component 72–78 and a respective supplemental heater 52–58; each component 72–78 being located between a respective supplemental heater 52–58 and a respective evaporator 12–18; and each supplemental heater 52–58 being located just upstream of a respective evaporator 12–18.

Generally speaking, the suitability of supplemental heaters will depend upon a plurality of factors, e.g., cost, supplemental heater placement, specific power requirements, etc. Specific example of a suitable heater include silicon rubber heaters and kapton heaters. Moreover, suitable heaters may be obtained from OMEGA Inc. of Stamford, Conn., and WATLOW ELECTRIC MANUFACTURING CO. of St. Louis, Mo. The manner in which the supplemental heaters 52–58 may be independently controlled will be discussed in greater detail hereinbelow.

In operation, refrigerant, in multiphase (i.e., liquid and gas) form, flows through the series of evaporators 12–18 at a controlled mass flow rate. The term "controlled mass flow rate" in this context refers to the regulation of refrigerant flow through the series of evaporators 12–18, such that the amount of refrigerant flow is contingent upon the combined heat load of Q1–Q4. According to a preferred embodiment of the invention, the heat load produced by each supplemental heater 52–58 is independently controlled such that each corresponding component 72–78 substantially receives relatively only a sufficient amount of heat to maintain the temperature of the corresponding component 72–78 above a predetermined minimum temperature. In this respect, when a component 72, for example, produces relatively less heat than the other components 76–78, the supplemental heater 52 may produce heat, such that, the amount of heat produced is dependent upon the amount of heat required to raise the temperature of component 72 to be above a predetermined minimum temperature.

Referring again to FIG. 1, refrigerant enters the compressor 30 through a compressor inlet 32. The compressor 30 increases the pressure and temperature of the refrigerant before the refrigerant exits through a compressor outlet 34. The compressor 30 may impart additional heat ("$W_{IN}$") on the refrigerant as the refrigerant is compressed. The speed of the compressor 30 and thus the level of compression of the refrigerant may be controlled by a programmable logic controller ("PLC") 90. The manner in which the compression level is controlled by altering the speed of the compressor 30 will be discussed in greater detail herein below.

The refrigerant then flows through the refrigerant line 20 into a condenser 36 through a condenser inlet 38. The condenser 36 is capable of dissipating the combined Q1–Q4 plus $W_{IN}$ from the refrigerant. Within the condenser 36, in a process known to those skilled in the art, the refrigerant generally decreases in temperature. The refrigerant exits the condenser 36 through a condenser outlet 40, typically as a liquid (still at a relatively high pressure and temperature). The refrigerant then flows through the refrigerant line 20 into a electronic expansion valve 42, through a electronic expansion valve inlet 44. The electronic expansion valve 42 may be capable of enabling a specified refrigerant superheat to be generated within the refrigerant line 20 between the electronic expansion valve 42 and the superheat sensor 48. In this regard, the superheat sensor 48 may measure the temperature of the refrigerant ("$\Delta T_{SUP}$") and relay the $\Delta T_{SUP}$ via an input line 50 to the PLC 90. The electronic expansion valve 42 is controlled by the PLC 90, via an output line 80, such that the electronic expansion valve 42 may regulate the mass flow rate of the refrigerant in refrigerant line 20 to allow adequate superheat to be imparted on the refrigerant and ensure the refrigerant enters the compressor 30 as a gas. However, it is within the purview of this invention that any known expansion valve that may be controlled by the PLC 90 to suitably reduce the mass flow rate of the refrigerant fluid, thereby enabling the refrigerant fluid to absorb sufficient heat to ensure that the refrigerant is in a gaseous state upon entering the compressor 30, may be substituted for the electronic expansion valve 42 without departing from the scope and spirit of the invention. It is important that the refrigerant enters the compressor 30 as a gas because liquid, being incompressible, may damage the compressor 30 due to excessive pressure created by attempting to compress an incompressible fluid.

After exiting the electronic expansion valve 42 through an electronic expansion valve outlet 46, refrigerant flows through the refrigerant line 20 and enters the evaporators 12–18 by first going through the evaporator 12. Within the evaporator 12, the refrigerant receives (i.e., absorbs) the heat load Q1. As can be seen in FIG. 1, the heat load Q1 represents the combined heat load of a component 72 and a supplemental heater 52. The refrigerant then exits the evaporator 12, flows through the refrigerant line 20 and the process is repeated for evaporator 14, evaporator 16, and evaporator 18, whereupon the refrigerant exits the evaporator 18, having absorbed sufficient heat load to maintain the temperature of the components 72–78 within a predetermined temperature range. Thus, in one respect, the heat load of the multi-load thermal regulating system 10 maybe monitored to control the speed of the compressor 30 and thus the mass flow rate of refrigerant. According to a preferred embodiment, the temperatures of the components 72–78 ("$T_{72}$–$T_{78}$") are measured by temperature sensors 22–28 to monitor the heat load, such that, the temperature of the components 72–78 may be obtained. Although any suitable type of temperature sensor may be utilized in the present invention, examples of suitable temperature sensors include a thermocouple, thermistor, diode, temperature sensitive resistor, and the like. The temperature sensors 22–28 are connected to the PLC 90 via input lines 392–398. The PLC 90 is also connected to the compressor 30 via an output line 64. The PLC 90 is configured to control the amount of compression the compressor 30 applies to the refrigerant based upon the measured $T_{72}$–$T_{78}$ of the components, to thereby control the mass flow rate of the refrigerant throughout the multi-load thermal regulating system 10. Although any suitable PLC 90 may be utilized with the present invention, examples of suitable PLC's 90 include those manufactured by SIEMENS AG of Augsburg, Germany.

In addition, a relay 92 may be utilized in any well known manner to isolate the relatively high current, utilized to drive the compressor 30, from the typically low current utilized to power the PLC 90. Furthermore, it is within the scope of various embodiments of the invention that other relays may be utilized in a manner similar to above, to isolate the relatively lower currents powering the PLC 90 from the relatively higher currents powering devices controlled by the PLC 90. For example, although not explicitly shown in FIG. 1, relays may be placed between the PLC 90 and some or all of the supplemental heaters 52–58. Although any suitable relay 92 may be utilized in the various embodiments of the invention, examples of suitable relays include those manufactured by SIEMENS AG of Augsburg Germany.

The temperature sensors 22–28 may be integrated within the components 72–78, or the temperature sensors may be attached to respective components by any known means which allows for thermal transfer from the components to the temperature sensors. Additionally, the temperature sensors 22–28 may also be positioned to measure the temperature of the evaporators 12–18 without deviating from the scope and spirit of the present invention.

Additionally, the PLC 90 may be configured to determine if a respective component 72–78 requires supplemental heat based on the measured $T_{72}$–$T_{78}$. The PLC 90 may independently control each supplemental heater 52–58 via a respective output line 382–388. The PLC 90 may further be configured with a delay counter. The delay counter may delay the manipulation of the supplemental heaters 52–58 by a predetermined amount of time. Generally speaking, the predetermined amount of time will depend upon a plurality of factors, e.g., system application, compressor size, thermal response time of evaporators, refrigerant flow rate, optimization, etc.

Moreover, each supplemental heater 52–58, may be independently controlled by a separate controller (not shown). In this respect, the temperature sensors 22–28 may be connected to the separate controller via input lines (not shown). The separate controller may receive the $T_{72}$–$T_{78}$ from separate temperature sensors in addition to those illustrated in FIG. 1. In either event, it is generally within the scope and spirit of the present invention that the separate controller receives the respective component temperatures $T_{72}$–$T_{78}$. In addition, the separate controller may independently control each supplemental heater 52–58, based on the $T_{72}$–$T_{78}$. The separate controller may further be configured with a delay counter operating in a manner of the delay counter mentioned hereinabove. Furthermore, a plurality of controllers may be utilized to control each of the supplemental heaters 52–58 without deviating from the scope and spirit of the present invention.

Figure 2:
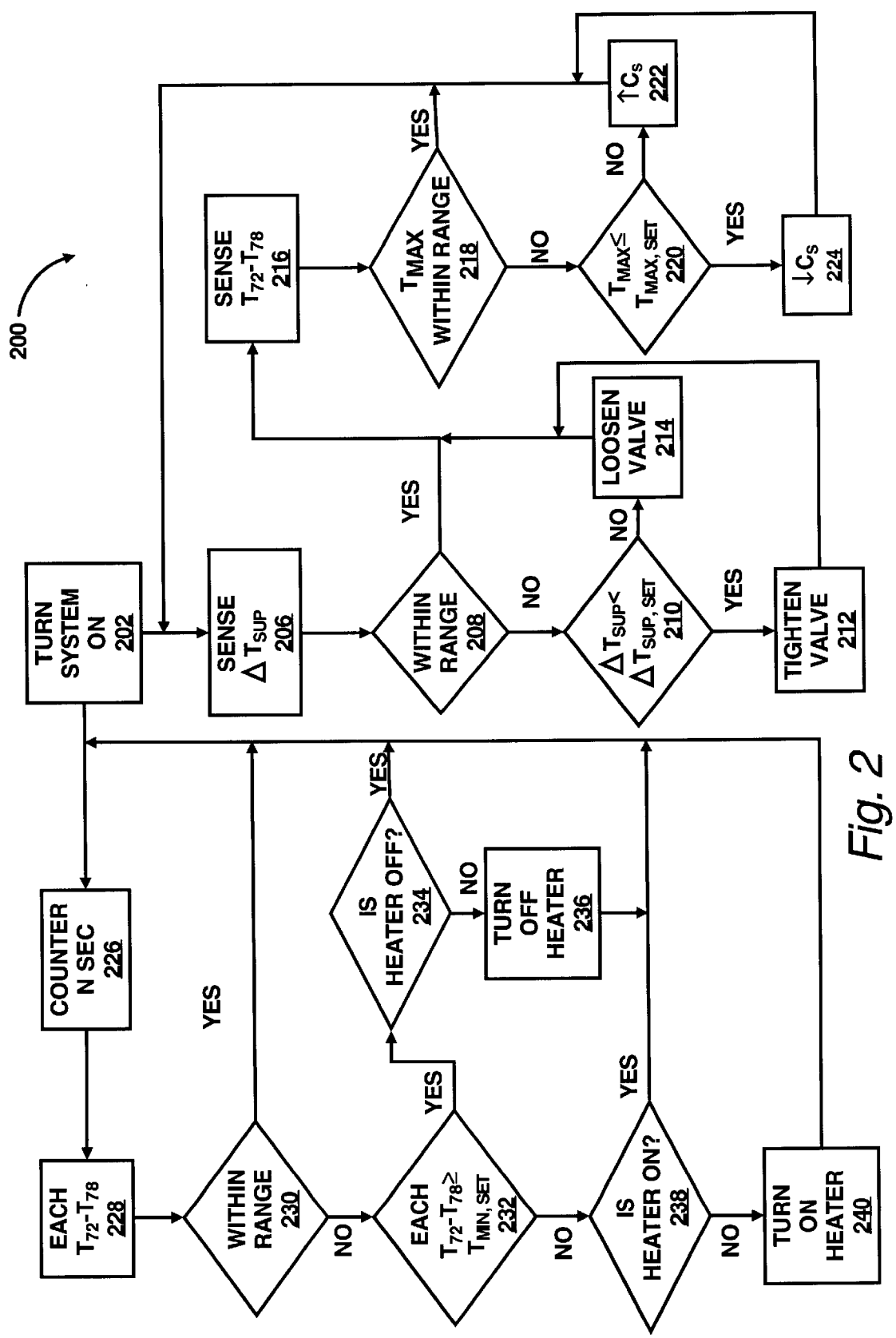
FIG. 2 is a flow chart depicting a manner in which the embodiment illustrated in FIG. 1 may be practiced.

FIG. 2 is a flow diagram 200 depicting a manner in which the embodiment illustrated in FIG. 1 may be practiced. Accordingly, the following description of FIG. 2 will be made with particular reference to those features illustrated in FIG. 1. As seen in FIG. 2, after the multi-load thermal regulating system 10 is turned on at step 202, the refrigerant begins to flow through the multi-load thermal regulating system 10. The $\Delta T_{SUP}$ is measured by the superheat sensor 48 at step 206. The $\Delta T_{SUP}$ is relayed to the PLC 90 via the input line 50. In step 208, the PLC 90 determines if the $\Delta T_{SUP}$ is within a predetermined range. The temperature range is determined based upon system design, the amount of load variability expected among the components, etc. In general, the temperature range may depend upon the following factors: system application, compressor size, thermal response time of evaporators, optimization of the system, refrigerant flow rate, etc. If the $\Delta T_{SUP}$ is within the predetermined range, the $T_{72}$–$T_{78}$ is sensed in step 216. If the $\Delta T_{SUP}$ is determined to be outside of the predetermined range, the $\Delta T_{SUP}$ is compared to a predetermined set temperature ("$\Delta T_{SUP,SET}$") in step 210. If, in step 210, the $\Delta T_{SUP}$ is determined to be less than the $\Delta T_{SUP,SET}$, the PLC 90 may manipulate the electronic expansion valve 42 to reduce the flow of refrigerant through the electronic expansion valve in step 212. If, in step 210, the $\Delta T_{SUP}$ is determined to be greater than or equal to the $\Delta T_{SUP,SET}$, the PLC 90 may manipulate the electronic expansion valve 42 to increase the flow of refrigerant through the electronic expansion valve in step 214. After each step 212 and 214, the $T_{72}$–$T_{78}$ is sensed in step 216.

In step 216, the $T_{72}$–$T_{78}$ are sensed by the respective temperature sensors 22–28. The $T_{72}$–$T_{78}$ measurements are then relayed to the PLC 90 via the respective input lines 392–398. The PLC 90 compares the $T_{72}$–$T_{78}$ measurements and determines the maximum component temperature ("$T_{MAX}$"). However, the $T_{MAX}$ may alternatively be determined by performing other calculations on the $T_{72}$–$T_{78}$, such as averaging the $T_{72}$–$T_{78}$ measurements without deviating from the scope and spirit of the present invention. In step 218, the PLC 90 determines if the $T_{MAX}$ is within a predetermined range. The predetermined range is determined based upon system design, the amount of load variability expected among the components, etc. In general, the predetermined range may depend upon the following factors: system application, compressor size, thermal response time of evaporators, optimization of the system, refrigerant flow rate, etc. If the $T_{MAX}$ is within the predetermined range, the $\Delta T_{SUP}$ is measured again in step 206. If the $T_{MAX}$ is determined to be outside of the predetermined range, the $T_{MAX}$ is compared to a predetermined maximum temperature set point ("$T_{MAX,SET}$") in step 220. The $T_{MAX,SET}$ is determined based upon system design and the amount of load variability expected among the components. In general, the $T_{MAX,SET}$ may depend upon the following: component manufactures specifications, system application, proximity to dew point, compressor size, thermal response time of evaporators, optimization of the system, refrigeration flow rate, etc.

If, in step 220, the $T_{MAX}$ is determined to be greater than the $T_{MAX,SET}$, the PLC 90 controls the compressor 30 via the output line 64 to increase its capacity, in step 222. If, in step 220, the $T_{MAX}$ is determined to be less than or equal to the $T_{MAX,SET}$, the PLC 90 controls the compressor 30 via the output line 64 to decrease its capacity, in step 224. Additionally, after each step 222 and 224, the $\Delta T_{SUP}$ is measured again in step 206.

Additionally and concurrently with steps 202–224 above, in step 226, a counter may be initialized by the PLC 90 at 0 seconds. At N seconds later, the $T_{72}$–$T_{78}$ may be sensed by the respective temperature sensors 22–28 in step 228. The time N seconds is determined based upon system design and the amount of load variability expected among the components, etc. In general, the time N may depend upon the following factors: system application, compressor size, thermal response time of evaporators, optimization of the system, refrigerant flow rate, etc.

The following steps 228–240 may be performed independently and substantially concurrently for each supplemental heater 52–58. In the following discussion, although specific reference is made to the manner of controlling the temperature of component 72 utilizing supplemental heater 52, it is to be understood that steps 228–240 are carried out for each of the supplemental heaters 52–58, independently of one another and may be carried out simultaneously. Additionally, although specific reference is made to the PLC 90 controlling the supplemental heaters 52–58, it is to be understood that steps 228–240 may be carried out by a separate controller or plurality of respective controllers without deviating from the scope and spirit of the present invention. For example, in step 228, the $T_{72}$ is sensed by the temperature sensor 22. The $T_{72}$ is then relayed to the PLC 90 via the input line 392. In step 230, the PLC 90 determines if the $T_{72}$ is within a predetermined range. The predetermined range is determined based upon system design, the amount of load variability expected among the components 72–78, etc. In general, the predetermined range may depend upon the following factors: electrical timing requirements, allowable mechanical stress due to thermal expansion, proximity to dew point, etc. If the $T_{72}$ is within the predetermined range, the PLC 90 re-initializes the counter to 0 seconds in step 226. If the $T_{72}$ is determined to be outside of the predetermined range, the $T_{72}$ is compared to a predetermined minimum temperature set point ("$T_{MIN,SET}$") in step 232.

The $T_{MIN,SET}$ is determined based upon the predetermined minimum temperature used in the control of the compressor 30, as well as, system design, the amount of load variability expected among the components, etc. In general, the $T_{MIN,SET}$ may depend upon the following factors: proximity to dew point, system application, compressor size, thermal response time of evaporators, optimization of the system, refrigerant flow rate, etc. If, in step 232, the $T_{72}$ is determined to be greater than or equal to the $T_{MIN,SET}$, the on/off status of the supplemental heater 52 is determined in step 234. The on/off status of the supplemental heater 52 may, in general, be determined by: measuring the current flow to the supplemental heater 52, checking the supplemental heater 52 switch status (on/off), etc.

If, in step 234, it is determined that the supplemental heater 52 is off, the PLC 90 reinitializes the counter to 0 seconds in step 226. If, in step 234, it is determined that the supplemental heater 52 is on, the PLC 90 controls the supplemental heater 52 via the output line 382 to turn off the supplemental heater 52 in step 236. If, in step 232, the $T_{72}$ is determined to be less than the $T_{MIN,SET}$, the on/off status of the supplemental heater 52 is determined in step 238. If, in step 238, it is determined that the supplemental heater 52 is on, the PLC 90 may re-initialize the counter to 0 seconds in step 226. If, in step 238, it is determined that the supplemental heater 52 is off, the PLC 90 controls the supplemental heater 52 via the output line 382 to turn on the supplemental heater 52 in step 240. After each step 236 and 240, the PLC 90 re-initializes the counter to 0 seconds in step 226.

As an alternative to the PLC 90, at least one separate controller (not shown) may be utilized to independently control the supplemental heaters 52–58 without deviating from the scope and spirit of the present invention. In this respect, the separate controller(s) may each possess a counter. The $T_{72}$–$T_{78}$ may be relayed to the separate controller(s) to control each of the components 72–78. In this regard, the separate controller operates in a similar fashion to the PLC 90 described hereinabove.

For example, additionally and concurrently with steps 202–224 above, in step 226, at least one counter connected to the separate controller(s) may be initialized at 0 seconds, and at N seconds later, the $T_{72}$–$T_{78}$ may be sensed in step 228. The following steps 228–240 may be performed independently and substantially concurrently for each supplemental heater 52–58. In the following discussion, although specific reference is made to the manner of controlling the temperature of component 72 utilizing supplemental heater 52, it is to be understood that steps 228–240 are carried out for each of the supplemental heaters 52–58, independently of one another and may be carried out simultaneously. For example, in step 228, the temperature of component 72 ("$T_{72}$") is sensed by the temperature sensor 22 and relayed to the separate controller for component 72. In either case, the separate controller or the respective controller is configured to control the supplemental heater 52.

In step 230, it is determined if the $T_{72}$ is within a predetermined range. If the $T_{72}$ is within the predetermined range, the counter on the separate controller is again initialized to 0 seconds in step 226. If the $T_{72}$ is determined to be outside of the predetermined range, the $T_{72}$ is compared to a predetermined minimum temperature set point ("$T_{MIN,SET}$") in step 232. If, in step 232, the $T_{72}$ is determined to be greater than or equal to the $T_{MIN,SET}$, the on/off status of the supplemental heater 52 is determined in step 234. If, in step 234, it is determined that the supplemental heater 52 is off, the counter is again initialized to 0 seconds in step 226. If, in step 234, it is determined that the supplemental heater 52 is on, the supplemental heater 52 is turned off in step 236. If, in step 232, the $T_{72}$ is determined to be less than the $T_{MIN,SET}$, the on/off status of the supplemental heater 52 is determined in step 238. If, in step 238, it is determined that the supplemental heater 52 is on, the counter is again initialized to 0 seconds in step 226. If, in step 238, it is determined that the supplemental heater 52 is off, the supplemental heater 52 is turned on in step 240. After each step 236 and 240, the counter on the separate controller is again initialized to 0 seconds in step 226.

It is to be understood that the above-descriptions of the present invention made specific reference to supplemental heater 52 for illustrative purposes only and that the manner in which supplemental heater 52 may be manipulated is equally applicable to the other supplemental heaters 54–58. Additionally, it is to be understood that by way of the principles of the present invention, each of the supplemental heaters 52–58 may be independently and simultaneously operated.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A thermal regulating system for maintaining individual temperatures of a plurality of heat generating components within a predetermined temperature range, said thermal regulating system comprising:

a refrigeration system having a refrigerant contained in a refrigerant line, an electronically controllable valve, said valve being configured to control superheat formation in said refrigeration system, and a plurality of evaporators configured for thermal attachment to said heat generating components, said plurality of evaporators being configured in a serial arrangement with respect to each other;

a supplemental heating system; and wherein said refrigeration system and said supplemental heating system are configured to maintain each of said plurality of heat generating components within said predetermined temperature range.

2. The thermal regulating system of claim 1, wherein said refrigeration system comprises a variable capacity compressor operable to vary a mass flow rate of said refrigerant through said refrigerant line at various levels of compression between a fully on and a fully off condition.

3. The thermal regulating system of claim 2, wherein each evaporator is configured for thermal attachment to a respective heat generating component, and wherein said mass flow rate of said refrigerant through said plurality of evaporators is configured to be controlled according to a heat load applied to said refrigeration system.

4. The thermal regulating system of claim 2, further comprising:

a controller operable to control the capacity of the compressor through an output line connected between said controller and said compressor;

a plurality of input lines connected between said controller and a plurality of temperature sensors attached to respective ones of said heat generating components; and wherein said controller is operable to control the capacity of the compressor in response to temperature measurements transmitted to the controller by said temperature sensors.

5. The thermal regulating system of claim 4, wherein said controller comprises a programmable logic controller with a relay.

6. The thermal regulating system of claim 1, wherein said valve is positioned generally upstream of said plurality of evaporators, said valve being connected to a sensor to detect superheat in said refrigerant exiting said plurality of evaporators, said valve being operable to vary the mass flow rate of said refrigerant through said plurality of evaporators based upon said detected superheat, to thereby control the amount of refrigerant superheat formed in the plurality of evaporators.

7. The thermal regulating system of claim 6, wherein said valve is controlled by a programmable logic controller.

8. The thermal regulating system of claim 1, wherein said supplemental heating system comprises:

a plurality of supplemental heaters, each of said supplemental heaters being operable to heat a respective heat generating component.

9. The thermal regulating system of claim 8, wherein each of said supplemental heaters is independently controlled by respective controllers.

10. The thermal regulating system of claim 8, wherein said supplemental heaters are independently controlled by a programmable logic controller.

11. A multi-load thermal regulating system for maintaining individual temperatures of a plurality of heat generating components within a predetermined temperature range, said thermal regulating system comprising:

a plurality of evaporators, each of said evaporators being thermally attachable to a respective heat generating component, said plurality of evaporators being connected in a serial arrangement with respect to one another;

a plurality of supplemental heaters, each of said supplemental heaters operable to supply supplemental heat to respective ones of said heat generating components;

a refrigerant line for conducting refrigerant through said plurality of evaporators;

a variable speed compressor connected to said refrigerant line and operable to control the mass flow rate of said refrigerant through said refrigerant line;

an electronically controllable valve connected to said refrigerant line and configured to be manipulated by a controller in response to the superheat of said refrigerant, wherein the superheat is sensed by a superheat sensor, and wherein said electronically controllable valve is operable to control the superheat of said refrigerant between said electronically controllable valve and said superheat sensor; and said controller further configured to transmit signals to said variable speed compressor to vary the mass flow rate of said refrigerant in response to a plurality of sensed temperature measurements measured by a plurality of component temperature sensors.

12. The multi-load thermal regulating system of claim 11, wherein said controller comprises a programmable logic controller.

13. A system for maintaining temperatures of a plurality of heat generating components within a predetermined temperature range, said system comprising:

means for absorbing heat generated by the heat generating components, said heat absorbing means being arranged in a serial configuration relative to each other;

means for cooling a refrigerant heated in the heat absorbing means;

means for controlling refrigerant flow through said means for absorbing heat, said means for controller refrigerant flow comprising an electronically controllable valve; and means for supplying supplemental heat to the heat absorbing means to control a temperature of refrigerant flowing therethrough.

14. The system according to claim 13, wherein said means for cooling a refrigerant comprises a variable capacity compressor.

15. The system according to claim 14, further comprising:

means for detecting the temperatures of the plurality of heat generating components; and means for controlling the variable capacity compressor based on the detected temperatures of the plurality of heat generating components.

* * * * *